(12) United States Patent
Mizuno et al.

(10) Patent No.: US 10,144,849 B2
(45) Date of Patent: Dec. 4, 2018

(54) POLISHING COMPOSITION AND POLISHING METHOD USING THE SAME

(75) Inventors: Takahiro Mizuno, Komaki (JP); Yoshihiro Izawa, Kakamigahara (JP); Tomohiko Akatsuka, Ichinomiya (JP)

(73) Assignee: FUJIMI INCORPORATED, Kiyosu-shi, Aichi-ken (JP)

( * ) Notice: Subject to any disclaimer, the term of this patent is extended or adjusted under 35 U.S.C. 154(b) by 0 days.

(21) Appl. No.: 12/864,811

(22) PCT Filed: Jan. 29, 2009

(86) PCT No.: PCT/JP2009/051510
§ 371 (c)(1),
(2), (4) Date: Jul. 27, 2010

(87) PCT Pub. No.: WO2009/096495
PCT Pub. Date: Aug. 6, 2009

(65) Prior Publication Data
US 2010/0301014 A1 Dec. 2, 2010

(30) Foreign Application Priority Data

Feb. 1, 2008 (JP) ................................. 2008-023229
Jun. 10, 2008 (JP) ................................. 2008-151969

(51) Int. Cl.
*C09G 1/02* (2006.01)
*H01L 21/02* (2006.01)
*H01L 21/3105* (2006.01)
*H01L 21/321* (2006.01)
*C09K 3/14* (2006.01)

(52) U.S. Cl.
CPC .............. *C09G 1/02* (2013.01); *C09K 3/1436* (2013.01); *C09K 3/1463* (2013.01); *H01L 21/02024* (2013.01); *H01L 21/31053* (2013.01); *H01L 21/3212* (2013.01)

(58) Field of Classification Search
CPC . C09G 1/02; H01L 21/3212; H01L 21/31053; H01L 21/02024
USPC .................... 252/79.1, 79.4; 216/83; 438/693
See application file for complete search history.

(56) References Cited

U.S. PATENT DOCUMENTS

| | | | |
|---|---|---|---|
| 4,269,959 A * | 5/1981 | Lawton ................. | C08F 220/14 428/402 |
| 4,913,841 A * | 4/1990 | Zeman ..................... | C11D 1/92 510/108 |
| 4,968,381 A | 11/1990 | Prigge et al. | |
| 5,627,019 A * | 5/1997 | Vandenabeele et al. | 430/569 |
| 5,713,969 A * | 2/1998 | Shibata et al. ................. | 51/307 |
| 5,733,819 A * | 3/1998 | Kodama et al. ............. | 438/692 |
| 6,447,694 B1 | 9/2002 | Lee et al. | |
| 7,198,549 B2 * | 4/2007 | Steckenrider ........... | B24B 37/24 451/36 |
| 7,381,690 B1 * | 6/2008 | Ding et al. ..................... | 508/137 |
| 7,410,409 B1 * | 8/2008 | Koyama et al. ................ | 451/36 |
| 2001/0011515 A1 * | 8/2001 | Aoki ........................ | C09G 1/02 106/14.42 |
| 2001/0020234 A1 * | 9/2001 | Shah et al. ...................... | 705/62 |
| 2002/0019565 A1 * | 2/2002 | Berk et al. ..................... | 562/553 |
| 2002/0175983 A1 * | 11/2002 | Ishikawa et al. ............. | 347/100 |
| 2003/0102457 A1 * | 6/2003 | Miller ...................... | C09G 1/02 252/79.1 |
| 2003/0121214 A1 * | 7/2003 | Ishibashi ......................... | 51/309 |
| 2003/0124959 A1 * | 7/2003 | Schroeder et al. ............. | 451/41 |
| 2003/0194879 A1 * | 10/2003 | Small et al. ................... | 438/753 |
| 2004/0055998 A1 * | 3/2004 | Letertre et al. ................. | 216/52 |
| 2004/0065022 A1 * | 4/2004 | Machii ..................... | C09G 1/02 51/309 |
| 2004/0072943 A1 * | 4/2004 | Morihiro et al. ............. | 524/556 |

(Continued)

FOREIGN PATENT DOCUMENTS

CN 1296049 A 5/2001
CN 1572017 A 1/2005

(Continued)

OTHER PUBLICATIONS

Rochow, The Chemistry of Silicon, 1973, Pergamon Press, first paragraph p. 1338, copyright page, cover.*
New Jersey Department of Health, Hazardous Substance Fact Sheet Sulfuric Acid, 2008, New Jersey Department of Health, first page.*
Derwent, Derwent 2009-G84703,2009, Derwent, 1 page.*
Yahoo, Acids and bases. Oxidation and reduction, Dec. 24, 2009, Yahoo, Date stamp, tittle, paragraph discusing oxidation.*
Colorado State University, Dissociation Constants of Organic Acids and Bases, Sep. 3, 2010, Colorado State University, date stamp, tittle, Trimethylamine oxide pka.*
Wikipedia, pH, Oct. 6, 2016, Wikipedia, tittle, first paragraph, discussion of acid and pH.*

(Continued)

*Primary Examiner* — Binh X Tran
(74) *Attorney, Agent, or Firm* — Vidas, Arrett & Steinkraus, P.A.

(57) ABSTRACT

A polishing composition contains a nitrogen-containing compound and abrasive grains, and the pH of the composition is in the range of 1 to 7. The nitrogen-containing compound in the polishing composition preferably has a structure expressed by a formula: $R^1$—$N$(—$R^2$)—$R^3$ in which $R^1$, $R^2$, and $R^3$ each represent an alkyl group with or without a characteristic group, two of $R^1$ to $R^3$ may form a part of a heterocycle, and two of $R^1$ to $R^3$ may be identical and form a part of a heterocycle with the remaining one. Alternatively, the nitrogen-containing compound is preferably selected from a group consisting of a carboxybetaine type ampholytic surfactant, a sulfobetaine type ampholytic surfactant, an imidazoline type ampholytic surfactant, and an amine oxide type ampholytic surfactant. A polishing composition may contain a water-soluble polymer and abrasive grains, and the pH of the composition is in the range of 1 to 8.

14 Claims, No Drawings

(56) References Cited

U.S. PATENT DOCUMENTS

| | | | |
|---|---|---|---|
| 2004/0134873 A1* | 7/2004 | Yao | C09G 1/02 216/2 |
| 2004/0148867 A1* | 8/2004 | Matsumi | C09G 1/02 51/298 |
| 2004/0152309 A1* | 8/2004 | Carter | C03C 19/00 438/689 |
| 2004/0194392 A1 | 10/2004 | Takemiya et al. | |
| 2005/0014667 A1* | 1/2005 | Aoyama et al. | 510/175 |
| 2005/0079803 A1 | 4/2005 | Siddiqui et al. | |
| 2005/0090109 A1* | 4/2005 | Carter et al. | 438/692 |
| 2005/0192381 A1* | 9/2005 | Bringley et al. | 523/201 |
| 2005/0194358 A1* | 9/2005 | Chelle | B24B 37/044 216/88 |
| 2005/0201969 A1* | 9/2005 | Dorschner et al. | 424/70.13 |
| 2005/0215183 A1 | 9/2005 | Siddiqui et al. | |
| 2005/0287931 A1* | 12/2005 | Saegusa et al. | 451/41 |
| 2006/0076317 A1 | 4/2006 | De Rege Thesauro et al. | |
| 2006/0124594 A1* | 6/2006 | Lim et al. | 216/88 |
| 2006/0144824 A1 | 7/2006 | Carter et al. | |
| 2006/0196848 A1 | 9/2006 | Carter et al. | |
| 2006/0228999 A1 | 10/2006 | Ferranti | |
| 2006/0242912 A1* | 11/2006 | Roh et al. | 51/308 |
| 2006/0289826 A1 | 12/2006 | Koyama et al. | |
| 2007/0093183 A1* | 4/2007 | Yoshikawa et al. | 451/41 |
| 2007/0093187 A1* | 4/2007 | Takenouchi | C09G 1/02 451/174 |
| 2007/0169421 A1 | 7/2007 | Koyama et al. | |
| 2007/0175104 A1* | 8/2007 | Nishiyama et al. | 51/307 |
| 2007/0209287 A1* | 9/2007 | Chen et al. | 51/307 |
| 2007/0213297 A1* | 9/2007 | Wong | 514/54 |
| 2007/0220813 A1* | 9/2007 | Nam et al. | 51/308 |
| 2007/0293048 A1* | 12/2007 | Lee | C09G 1/02 438/692 |
| 2008/0202037 A1* | 8/2008 | Oswald | C09G 1/02 51/308 |
| 2008/0220610 A1* | 9/2008 | Bayer et al. | 438/693 |
| 2008/0241081 A1* | 10/2008 | Suga et al. | 424/54 |
| 2009/0010973 A1* | 1/2009 | Stanier | A61K 8/25 424/401 |
| 2009/0029633 A1 | 1/2009 | Carter et al. | |
| 2009/0093505 A1* | 4/2009 | Bylemans | A01N 43/50 514/275 |
| 2009/0107520 A1* | 4/2009 | Lee et al. | 134/2 |
| 2011/0045741 A1* | 2/2011 | Ahn | C09G 1/02 451/28 |
| 2012/0003901 A1* | 1/2012 | Hu et al. | 451/36 |
| 2012/0107412 A1* | 5/2012 | Gammelsaeter | A61K 8/676 424/582 |

FOREIGN PATENT DOCUMENTS

| | | |
|---|---|---|
| CN | 1742066 A | 3/2006 |
| CN | 101040021 A | 9/2007 |
| JP | 1135026 A | 5/1989 |
| JP | 7249600 A | 9/1995 |
| JP | 8-295875 | 11/1996 |
| JP | 11302633 A | 11/1999 |
| JP | 2000144109 A | 5/2000 |
| JP | 2001031951 A | 2/2001 |
| JP | 2001-185514 A | 7/2001 |
| JP | 2002-525383 A | 8/2002 |
| JP | 2003-306669 A | 10/2003 |
| JP | 2004-172606 A | 6/2004 |
| JP | 2004266155 A | 9/2004 |
| JP | 2004-300348 A | 10/2004 |
| JP | 2005-034986 A | 2/2005 |
| JP | 2005-175437 A | 6/2005 |
| JP | 2006060205 A | 3/2006 |
| JP | 2007-019093 A | 1/2007 |
| JP | 2007051200 | 3/2007 |
| JP | 2007-227446 | 6/2007 |
| JP | 2007-305677 A | 11/2007 |
| JP | 2007311779 A | 11/2007 |
| JP | 2007-326916 A | 12/2007 |
| JP | 2007-335531 A | 12/2007 |
| WO | 2004/107429 A | 12/2004 |
| WO | 2005/000984 A | 1/2005 |

OTHER PUBLICATIONS

Holmes et al, Exploration of polymethacrylate structure-property correlatoins: Advances towards combinatorial and high-throughput methods for biomaterials discovery, May 2, 2008, progpolymsci, Tittle, and 4.1 Free Radical Polymerization.*

Wikipedia, N-Hydroxysuccinimide, Aug. 17, 2007, Wikipedia, date stamps, 1 paragraph.*

* cited by examiner

POLISHING COMPOSITION AND POLISHING METHOD USING THE SAME

CROSS-REFERENCE TO RELATED APPLICATIONS

Not applicable.

STATEMENT REGARDING FEDERALLY SPONSORED RESEARCH

Not applicable.

FIELD OF THE INVENTION

The present invention relates to a polishing composition and a polishing method using the same. The polishing composition is used primarily for polishing silicon material, which includes a simple substance of silicon such as silicon single crystal, amorphous silicon, and polysilicon and a silicon compound such as silicon nitride and silicon oxide.

BACKGROUND OF THE INVENTION

In semiconductor device manufacturing processes, for example, polishing may be conducted to remove at least part of a simple substance of silicon such as silicon single crystal, amorphous silicon, and polysilicon. Such polishing is normally conducted by using an alkaline polishing composition (refer to, for example, Patent Documents 1 and 2). However, most of known polishing compositions do not allow a simple substance of silicon to be polished at a high removal rate that sufficiently satisfies the requirement of users.

Also, in a case where a simple substance of silicon is polished together with a silicon compound such as silicon nitride and silicon oxide, the use of a neutral or acid polishing composition is desirable. However, known neutral and acid polishing compositions do not allow a simple substance of silicon to be polished at a high removal rate satisfying the requirement of users.

Prior art documents relevant to the present invention include the following Patent Documents 3 to 6 in addition to the above described Patent Documents 1 and 2.

Patent Document 1: Japanese National Phase Laid-Open Patent Publication No. 2002-525383
Patent Document 2: Japanese Laid-Open Patent Publication No. 7-249600
Patent Document 3: Japanese Laid-Open Patent Publication No. 2001-031951
Patent Document 4: Japanese Laid-Open Patent Publication No. 2006-060205
Patent Document 5: Japanese Laid-Open Patent Publication No. 11-302633
Patent Document 6: Japanese Laid-Open Patent Publication No. 2004-266155

SUMMARY OF THE INVENTION

Accordingly, it is an objective of the present invention to provide a same, the polishing composition being suitably used for polishing silicon material such polishing composition and a polishing method using the as a simple substance of silicon and a silicon compound.

To achieve the foregoing objective and in accordance with a first aspect of the present invention, a polishing composition containing a nitrogen-containing compound and abrasive grains is provided. The pH of the composition is in the range of 1 to 7.

The nitrogen-containing compound contained in the polishing composition of the first aspect preferably has a structure expressed by a formula (1): $R^1$—N(—$R^2$)—$R^3$ in which $R^1$, $R^2$, and $R^3$ each represent an alkyl group with or without a characteristic group, two of $R^1$ to $R^3$ may form a part of a heterocycle, and two of $R^1$ to $R^3$ may be identical and form a part of a heterocycle with the remaining one.

The compound having a structure expressed by the above formula (1) preferably has a structure expressed by a formula (2): $R^1$—N(—$R^2$)—C(=O)—$R^4$ in which $R^1$, $R^2$, and $R^4$ each represent an alkyl group with or without a characteristic group, and $R^1$ or $R^2$ may form a part of a heterocycle together with $R^4$. Alternatively, the compound having a structure expressed by the above formula (1) is preferably an amino acid type ampholytic surfactant or an amine type nonionic surfactant.

The nitrogen-containing compound contained in the polishing composition of the first aspect is preferably selected from a group consisting of a carboxybetaine type ampholytic surfactant, a sulfobetaine type ampholytic surfactant, an imidazoline type ampholytic surfactant, and an amine oxide type ampholytic surfactant.

In accordance with a second aspect of the present invention, a polishing composition is provided that contains a water-soluble polymer and abrasive grains, and the pH of the composition is in the range of 1 to 8.

The water-soluble polymer contained in the polishing composition of the second aspect is preferably selected from a group consisting of a polysaccharide, a polycarboxylic acid, a polycarboxylic amide, a polycarboxylic ester, a polycarboxylate, a polysulfonic acid, and a vinyl polymer.

In accordance with a third aspect of the present invention, a polishing method is provided in which a silicon material is polished using the polishing composition according to the above first or second aspect.

DETAILED DESCRIPTION OF THE PREFERRED EMBODIMENTS

First Embodiment

A first embodiment of the present invention will now be described.

A polishing composition of the present embodiment is manufactured by mixing a nitrogen-containing compound and abrasive grains in water, together with a pH adjuster and a pH buffer if necessary, such that the pH falls within the range of 1 to 7. Therefore, the polishing composition contains a nitrogen-containing compound, abrasive grains, and water, and if necessary, a pH adjuster and a pH buffer.

The polishing composition is used for polishing silicon material, that is, a simple substance of silicon such as silicon single crystal, amorphous silicon, and polysilicon and a silicon compound such as silicon nitride and silicon oxide. More particularly, the polishing composition is used for polishing a silicon substrate such as a single crystal silicon substrate, or for polishing a film of a simple substance of silicon such as an amorphous silicon film or a polysilicon film formed on a silicon substrate, or a film of silicon compound such as a silicon nitride film or a silicon oxide film formed on a silicon substrate. The film of silicon compound includes a low-dielectric-constant film of which the relative dielectric constant is 3 or lower.

Specific examples of nitrogen-containing compounds include amines, amides, imines, imides, ureas, ammoniums, quaternary ammoniums, amino acids, aminosulfonic acids, and aminophosphonic acids. Amines and amides are divided into primary types, secondary types, and tertiary types depending on the number of substituents on the nitrogen atom. The primary amines include methylamine, ethylamine, butylamine, ethylenediamine, glycine, alanine, and valine. The secondary amines include piperazine, piperidine, morpholine, N-methylglycine. The tertiary amines include methylpiperidine, ethylpiperidine, methylpyrrolidine, N,N-dimethylacetamide, and N,N-diethylacetamide.

A nitrogen-containing compound that can be suitably contained in the polishing composition is a compound having a structure expressed by a formula (1): $R^1$—N(—$R^2$)—$R^3$. In the formula (1), $R^1$, $R^2$, and $R^3$ each represent an alkyl group with or without a characteristic group. Two of $R^1$ to $R^3$ may form a part of a heterocycle. Alternatively, two of $R^1$ to $R^3$ may be identical and form a part of a heterocycle with the remaining one. Examples of the characteristic group include halogen, hydroxy, amino, imino, N-oxide, N-hydroxy, hydrazine, nitro, nitroso, azo, diazo, azido, oxy, epoxy, oxo, carbonyl, phenyl, phosphino, thio, S-oxide, and thioxy. Among compounds having a structure expressed by the formula (1), specific examples of compounds in which two of $R^1$ to $R^3$ form a part of a heterocycle include piperidine groups and their analogous compounds such as methylpiperidine and ethylpiperidine, pyrrolidone groups and their analogous compounds such as methylpyrrolidine, pyrrole groups and their analogous compounds such as methylpyrrole, morpholine groups and their analogous compounds such as methylmorpholine, piperazine groups and their analogous compounds such as methylpiperazine and dimethylpiperazine, and hexamethylene tetramine and its analogous compounds. Among compounds having a structure expressed by the formula (1), specific examples of compounds in which two of $R^1$ to $R^3$ are identical and form a part of a heterocycle together with the remaining one include imidazole, pyrazole, triazole, tetrazone, thiazole, isothiazole, oxazole, isoxazole, pyridine, pyrazine, pyrimidine, pyridazine, and analogous compounds of these. "Analogous compounds" in this description include derivatives.

Among compounds having a structure expressed by the formula (1), compounds having a structure expressed by a formula (2): $R^1$—N(—$R^2$)—C(=O)—$R^4$ can be suitably used as the nitrogen-containing compound contained in the polishing composition. $R^1$ or $R^2$ may form a part of a heterocycle together with $R^4$. Examples of the characteristic group are as shown above. Specific examples of compounds having a structure expressed by the formula (2) include N,N-dimethylacetamide, 1-methyl-2-pyrrolidone, N,N-dimethylacrylamide, 1-vinyl-2-pyrrolidone, N,N-dimethylacetoacetamide, N,N-diethylacrylamide, sodium N-lauroylsarcosinate hydrate, 1-(2-hydroxyethyl)-2-pyrrolidone, N-oleoyl sarcosine, 1-cyclohexyl-2-pyrrolidone, N-phenylmaleimide, N-vinyl-ε-caprolactam, N-lauroyl sarcosine, 1-n-octyl-2-pyrrolidone, N-acetoacetylmorpholine, N-(2-ethylhexyl)-5-norbornene-2,3-dicarboximide, 1,3,5-triacryloylhexahydro-1,3,5-triazine, 4-acryloylmorpholine, N,N-diethylacetoacetamide, N-acetyl-ε-caprolactam, N-phthaloylglycine, 4,4'-bismaleimidodiphenylmethane, N,N-dimethylpropionamide, 4-acetylmorpholine, N-hydroxymethylphthalimide, N,N-diethyldodecaneamide, N,N'-1,3-phenylenedimaleimide, N,N-diethylacetamide, N-(2-hydroxyethyl)phthalimide, N-carbethoxyphthalimide, N-methyl-ε-caprolactam, bis(3-ethyl-5-methyl-4-maleimidophenyl)methane, creatinine, 1-acetyl-4-(4-hydroxyphenyl)piperazine, N,N-diethylchloroacetamide, N-(2-bromoethyl)phthalimide, 1-ethyl-2,3-dioxopiperazine, 1-ethyl-2-pyrrolidone, N-(3-bromopropyl)phthalimide, bis(N,N-dimethylacetamide)hydrotribromide, N-methylmaleimide, 3',6'-bis(diethylamino)-2-(4-nitrophenyl)spiro[isoindole-1, 9'-xanthene]-3-one, penicillin G potassium, N,N-diethylpropionamide, sodium N-lauroylsarcosinate hydrate, chlormezanone, N-methyl-4-nitrophthalimide, 6-aminopenicillanic acid, phthalimidoacetone, N-acetylphthalimide, 3-benzylrhodanine, 3-ethylrhodanine, N,N,N',N'-tetraacetylethylenediamine, 3-allylrhodanine, N-cyclohexylmaleimide, N-(2,4,6-trichlorophenyl)maleimide, cephalexin, N-methylphthalimide, phthalimide DBU, 2-phthalimidoacetaldehyde diethyl acetal, dichlormid, N-butylphthalimide, ampicillin, 4-ethyl-2,3-dioxo-1-piperazinecarbonyl chloride, rhodanine-3-acetic acid, N-ethylmaleimide, N-benzylphthalimide, 3,4,5,6-tetrafluoro-N-methylphthalimide, cefazolin sodium, 1-acetyl-4-piperidone, N-ethylsuccinimide, amoxicillin, N-(bromomethyl)phthalimide, 4-nitro-N-phenylphthalimide, 1-acetylpiperidine, 1-acetylpiperazine, 7-amino-desacetoxycephalosporanic acid, 1-(3-hydroxy propyl)-2-pyrrolidone, 4-amino-N-methylphthalimide, N,N,N',N'-tetramethylmalonamide, 1-acetyl-2-pyrrolidone, N-(4-bromobutyl)phthalimide, 1-butyl-2-pyrrolidone, trichloroacetyl isocyanate, cefotaxime sodium, ceftriaxone disodium, dibutyl N,N-diethylcarbamoylmethylphosphonate, phthalyl-DL-glutamic acid, 2-butyl-1,3-diazaspiro[4.4]non-1-en-4-one hydrochloride, ceftazidime, N,N',N'',N'''-tetraacetylglycoluril, oxacillin sodium, 1-acetyl-2-imidazolidinone, methyl 2-oxo-1-pyrrolidineacetate, 2-cyano-N,N-dimethylacetamide, loperamide hydrochloride, N-benzylmaleimide, rhodanine-3-propionic acid, N-phthaloyl-DL-glutamic acid, (+)-N,N,N',N'-tetramethyl-L-tartardiamide, N-(4-chlorophenyl)phthalimide, diethyl (phthalimidomethyl)phosphonate, (−)-N,N,N',N'-tetramethyl-D-tartardiamide, 7-aminocephalosporanic acid, N-(4-bromophenyl)phthalimide, N,N-dimethylmethacrylamide, 1-benzyl-5-phenylbarbituric acid, piperine, tropicamide, captopril, N,N'-diacetylglycine, N-vinylphthalimide, diethyl phthalimidomalonate, (R)—N-glycidylphthalimide, (S)—N-glycidylphthalimide, N-phthaloyl-L-phenylalanine, phthaloyl-DL-alanine, 1,3,4,6-tetra-O-acetyl-2-deoxy-2-phthalimido-β-D-glucopyranose, N,N,N',N'-tetraethylmalonamide, N,N,N',N'-tetrapropylmalonamide, N,N,N',N'-tetrabutylmalonamide, N,N,N',N'-tetrapentylmalonamide, N-chloromethylphthalimide, cloxacillin sodium, N-(4-nitrophenyl)maleimide, N,N'-1,4-phenylenedimaleimide, 1,5-dimethyl-2-piperidone, L-alanyl-L-proline, N-decanoylsarcosine sodium salt, N-phthaloyl-L-glutamic acid, 1-[(2S)-3-(acetylthio)-2-methylpropionyl]-L-proline, dihexyl N,N-diethylcarbamylmethylenephosphonate, (S)-(+)-2-hydroxy-4-phthalimidobutyric acid, 2-bromo-2-cyano-N,N-dimethylacetamide, 1-acetylpyrrolidine, N-methylbis (trifluoroacetamide), penicillin G sodium, gliquidone, 1,3-dimethyl-2-thiohydantoin, 3-(N-acetyl-N-methylamino) pyrrolidine, lisinopril, trans-1-methyl-4-carboxy-5-(3-pyridyl)-2-pyrrolidinone, N-(3-buten-1-yl)phthalimide, (R)-(−)-4-benzyl-3-propionyl-2-oxazolidinone, (S)-(+)-4-benzyl-3-propionyl-2-oxazolidinone, NAM, piperacillin sodium, N-bromomethyl-2,3-dichloromaleimide, 4-methoxyphenyl-3,4,6-tri-O-acetyl-2-deoxy-2-phthalimido-β-D-glucopyranoside, 1,3-dicyclohexylbarbituric acid, glycylsarcosine, (S)-(+)-4-isopropyl-3-propionyl-2-oxazolidinone, (R)-(−)-4-isopropyl-3-propionyl-2-oxazolidinone, ketoconazole, N-chloromethyl-4-nitrophthalimide, 3-(N-acetyl-N-ethylamino)pyrrolidine, 4,4',4''-tris(4,5-dichlorophthalimido)trityl bromide, 4-methoxyphenyl-4,6-O-benzylidene-2-deoxy-2-phthalimido-β-D-glucopyranoside, 4-methoxyphenyl3-O-allyl-4,6-O-benzylidene-2-deoxy-2-phthalimido-β-D-glucopyranoside, methyl-3,4,6-tri-O-acetyl-2-deoxy-2-phthalimido-1-thio-β-D-glucopyranoside, 4-methoxyphenyl3-O-benzyl-4,6-O-benzylidene-2-deoxy-2-phthalimido-β-D-glucopyranoside, glycyl-L-proline, ergotamine tartrate, 3-acryloyl-2-oxazolidinone, N-(8-hydroxyoctyl)phthalimide, (R)-1-acetyl-3-pyrrolidinol, dihydroergotamine mesilate, 3-maleimidopropionic acid, N-(1-pyrenyl)maleimide, N-succinimidyl 3-maleimidobenzoate, dihydroergotamine tartrate, N-succinimidyl 4-maleimidobutyrate, N-succinimidyl 3-maleimidopropionate, N-succinimidyl 6-maleimidohexanoate, 1,2-bis(maleimido)ethane, 1,6-bismaleimidohexane, N-(4-aminophenyl)maleimide, N-ethyl-N-(4-picolyl)atropamide, N-[4-(2-benzimidazolyl)phenyl]maleimide, (1R,2R)-2-(anthracene-2,3-dicarboximido)cyclohexanecarboxylic acid, (1S,2S)-2-(anthracene-2,3-dicarboximido)cyclohexanecarboxylic acid, (1R,2R)-2-(naphthalene-2,3-dicarboximido)cyclohexanecarboxylic acid, (1S,2S)-2-(naphthalene-2,3-dicarboximido)cyclohexanecarboxylic acid, 6,7-methylenedioxy-4-methyl-3-maleimidocoumarin, methyl 2,4,7,8,9-penta-O-acetyl-N-acetylneuraminate, GlcNPhth[346Ac]β(1-3)Gal[246Bn]-β-MP, Gal[2346Ac]β(1-3)GlcNPhth[46Bzd]-β-MP, 4-methoxyphenyl 3-O-benzyl-2-deoxy-2-phthalimido-β-D-glucopyranoside, 4-methoxyphenyl-3,6-di-O-benzyl-2-deoxy-2-phthalimido-β-D-glucopyranoside, 4-methoxyphenyl-4-O-acetyl-3,6-di-O-benzyl-2-deoxy-2-phthalimido-β-D-glucopyranoside, 1,3-dimethyl-2-imidazolidinone, 1-(hydroxymethyl)-5,5-dimethylhydantoin, N-(cyclohexylthio)phthalimide, 1,3-dimethyl-3,4,5,6-tetrahydro-2(1H)-pyrimidinone, N-hydroxyphthalimide, tetramethylurea, N-chlorophthalimide, 3-(4-chlorophenyl)-1,1-dimethylurea, 3-(3,4-dichlorophenyl)-1,1-dimethylurea, 1,3-dimethylbarbituric acid, 3-methyl-2-oxazolidone, 7-(2-hydroxyethyl)theophylline, ethyl 1-piperazinecarboxylate, N-carbobenzoxyoxysuccinimide, 1,3-dimethyl-5-pyrazolon, diazolidinylurea, 1,1-dimethylurea, 1,1,3,3-tetraethylurea, 1-ethoxycarbonyl-4-piperidone, 1-allylhydantoin, 1-benzyl-5-ethoxyhydantoin, 1-methylhydantoin, N-(tert-butoxycarbonyl)-L-proline, N-carbobenzoxy-L-proline, N-[(9H-fluorene-9-ylmethoxy)carbonyl]-L-proline, 1-butylhydantoin, cis-1,3-dibenzyl-2-oxo-4,5-imidazolidinedicarboxylic acid, N-(2-chlorobenzyloxycarbonyloxy)succinimide, 1-dodecylhydantoin, ethyl 4-chloro-1-piperidinecarboxylate, 1,1-diethylurea, N,N,O-triacetylhydroxylamine, ethyl 4-hydroxy-1-piperidinecarboxylate, 1-benzylhydantoin, ethyl 4-amino-1-piperidinecarboxylate, 3-methanesulfonyl-2-oxo-1-imidazolidinecarbonyl chloride, 2-bromobenzyl succinimidyl carbonate, N-bromophthalimide, 9-fluorenylmethyl N-succinimidyl carbonate, 1,3,4,6-tetrakis(methoxymethyl)glycoluril, 2-oxo-1-imidazolidinecarbonyl chloride, captan, 1-hexadecylhydantoin, 1,1,3,3-tetrabutylurea, N-aminophthalimide, N,N'-dimethoxy-N,N'-dimethyloxamide, neostigmine bromide, 1-carbobenzoxypiperazine, N-allyloxyphthalimide, 1-(tert-butoxycarbonyl)-4-piperidone, 1,1-dimethyl-3-[3-(trifluoromethyl)phenyl]urea, diethylcarbamazine citrate, 1-(tert-butoxycarbonyl)-4-hydroxypiperidine, 1,5,5-trimethylhydantoin, neostigmine methylsulfate, di(N-succinimidyl)carbonate, N-methoxy-N-methylacetamide, 1,1'-(azodicarbonyl)dipiperidine, 3-ethyl(-)-thiazolidine-3,4-dicarboxylate, N-(tert-butoxycarbonyl)-L-prolinol, ethoxycarbonyl isothiocyanate, 2-chloro-N-methoxy-N-methylacetamide, N-(1,2,2,2-tetrachloroethoxycarbonyloxy)succinimide, N-(phenylthio)phthalimide, pyridostigmine bromide, N-carbobenzoxy-D-proline, N-(tert-butoxycarbonyl)-D-proline, N-(tert-butoxycarbonyl)-L-4-hydroxyproline, 2-(5-norbornene-2,3-dicarboximido)-1,1,3,3-tetramethyluronium tetrafluoroborate, 1-(tert-butoxycarbonyl)piperazine, (3S)-2-CBZ-1,2,3,4-tetrahydroisoquinoline-3-carboxylic acid, N-carbobenzoxy-L-proline tert-butyl, N-hydroxy-4-nitrophthalimide, N-methoxydiacetamide, (S)-(−)-3-tert-butoxycarbonyl-4-methoxycarbonyl-2,2-dimethyl-1,3-oxazolidine, N-[(9H-fluorene-9-ylmethoxy)carbonyl]-D-proline, N-(tert-butoxycarbonyl)-O-benzyl-L-serine N-succinimidyl ester, 1-(tert-butoxycarbonyl)isonipecotic acid, N,N,N',N'-tetramethyl-O—(N-succinimidyl)uronium tetrafluoroborate, 4-amino-1-tert-butoxycarbonyl piperidine, tert-butyl phthalimido carbonate, 3-(N-tert-butoxycarbonyl-N-methylamino)pyrrolidine, N-[2-(trimethylsilyl)ethoxycarbonyloxy]succinimide, N-(tert-butoxycarbonyl)-D-prolinol, 1-(tert-butoxycarbonyl)-4-piperidinemethanol, (S)-1-(tert-butoxycarbonyl)-3-pyrrolidinol, (R)-1-(tert-butoxycarbonyl)-3-pyrrolidinol, (R)-(+4-benzyl-3-propionyl-2-oxazolidinone, 1,1'-azobis(N,N-dimethylformamide), tris(carbobenzoxy)-L-arginine, diethyl(N-methoxy-N-methylcarbamoylmethyl)phosphonate, (3R)-(+)-1-(tert-butoxycarbonyl)-3-aminopyrrolidine, (3S)-(−)-1-(tert-butoxycarbonyl)-3-aminopyrrolidine, diphenyl(N-methoxy-N-methylcarbamoylmethyl)phosphonate, N-aminosuccinimide hydrochloride, N-succinimidyl 4-nitrophenylacetate, 1-(tert-butoxycarbonyl)-3-hydroxyazetidine, (S)-(+3-(tert-butoxycarbonyl)-4-formyl-2,2-dimethyl-1,3-oxazolidine, di(N-succinimidyl) 3,3'-dithiodipropionate, N-succinimidyl S-acetylthioglycolate, N-(diethylcarbamoyl)-N-methoxyformamide, N-succinimidyl 6-(2,4-dinitroanilino)hexanoate, (2S,4R)-1-(tert-butoxycarbonyl)-4-fluoro-2-pyrrolidinecarboxylic acid, (2S,4S)-1-(tert-butoxycarbonyl)-4-fluoro-2-pyrrolidinecarboxylic acid, N-succinimidyl D-biotin, succinimidyl 4-[3,5-dimethyl-4-(4-nitrobenzyloxy)phenyl]-4-oxobutyrate, (S)-1-(tert-butoxycarbonyl)-2-azetidinemethanol, (R)-1-(tert-butoxycarbonyl)-2-azetidinemethanol, N-tert-butoxycarbonyl-N-[3-(tert-butoxycarbonylamino)propyl]glycine, irinotecan hydrochloride, succinimidyl 6-[[7-(N,N-dimethylaminosulfonyl)-2,1,3-benzoxadiazol-4-yl]amino]hexanoate, succinimidyl (2R)-6-(tetrahydro-2H-pyran-2-yloxy)-2,5,7,8-tetramethylchroman-2-carboxylate, and phenyl N-benzyl-2-amino-4,6-O-benzylidene-2-N,3-O-carbonyl-2-deoxy-1-thio-β-D-glucopyranoside. When the polishing composition contains a compound having a structure expressed by the formula (2), the content of the compound in the polishing composition is preferably about 0.05 mol/L.

The reason why compounds having a structure expressed by the formula (2) are particularly suitable as the nitrogen-containing compound contained in the polishing composition is that these compounds are substantially neutral. When the nitrogen-containing compound used is substantially neutral, the pH of the polishing composition is easily adjusted to 7 or lower without adding a large amount of acid. In contrast, when the nitrogen-containing compound used is strongly-alkaline, a large amount of acid needs to be added to adjust the pH of the polishing composition to 7 or lower in some cases. Use of large amount of acid leads to aggregation of abrasive grains contained in the polishing composition.

Among compounds having a structure expressed by the formula (1), an amino acid type ampholytic surfactant and an amine type nonionic surfactant can also be suitably used as the nitrogen-containing compound contained in the polishing composition. Specific examples of amino acid type ampholytic surfactants include alkylamino monopropionic acid, alkylamino dipropionic acid, alkylamidosarcosine. Specific examples of amine type nonionic surfactants include polyoxyethylene alkylamino ether, alkyl diethanolamine, polyoxyethylene alkylamine, alkylamine to which polyoxypropylene and polyoxyethylene are added in blocks, and N,N',N'-tris(2-hydroxyethyl)-N-alkyl-1,3-diaminopropane. When the polishing composition contains an amino acid type ampholytic surfactant, the content of the surfactant in the polishing composition is preferably in the range of 0.002 to 0.20 g/L. When the polishing composition contains an amine type nonionic surfactant, the content of the surfactant in the polishing composition is preferably in the range of 0.002 to 1 g/L.

Other than compounds having a structure expressed by the formula (1), a carboxybetaine type ampholytic surfactant, a sulfobetaine type ampholytic surfactant, an imidazoline type ampholytic surfactant, and an amine oxide type ampholytic surfactant can be suitably used as the nitrogen-containing compound contained in the polishing composition. Specific examples of carboxybetaine type ampholytic surfactants include alkyldimethylamino betaine acetate (also known as alkylbetaine) and alkylamidopropyl dimethylamino betaine acetate (also known as alkylamidopropylbetaine). Specific examples of sulfobetaine type ampholytic surfactants include alkylhydroxysulfobetaine. Specific examples of imidazoline type ampholytic surfactants include 2-alkyl-N-carboxymethyl-N-hydroxyethyl imidazolium betaine and 2-higher fatty acid-N'-carboxymethyl-N'-hydroxyethylethylenediamine. Specific examples of amine oxide type ampholytic surfactants include alkyldimethylamine oxide and higher fatty acid amidopropyl dimethylamine oxide. When the polishing composition contains either of these ampholytic surfactants, the content of the surfactant in the polishing composition is preferably in the range of 0.002 to 0.20 g/L.

The type of the abrasive grains contained in the polishing composition is not particularly limited, but may be, for example, silicon dioxide, aluminum oxide, zirconium oxide, or cerium oxide. However, when the polishing composition is used for polishing silicon material, it is preferable to use silicon dioxide, and particularly colloidal silica or fumed silica. When silicon dioxide, particularly colloidal silica or fumed silica is used as abrasive grains, the removal rate of polishing silicon material using the polishing composition is significantly improved.

The average secondary particle size of the abrasive grains contained in the polishing composition is preferably 5 nm or more, more preferably 10 nm or more. The greater the average secondary particle size, the more improved the removal rate of polishing silicon material using the polishing composition becomes. In this respect, if the average secondary particle size of the abrasive grains is 5 nm or more, more specifically 10 nm or more, the removal rate of polishing silicon material using the polishing composition is improved to a level particularly suitable for practical use.

The average secondary particle size of the abrasive grains contained in the polishing composition is preferably 250 nm or less, more preferably 200 nm or less. The smaller the average secondary particle size, the more improved the dispersibility of the abrasive grains in the polishing composition becomes. In this respect, if the average secondary particle size of the abrasive grains is 250 nm or less, more specifically 200 nm or less, the dispersibility of the abrasive grains in the polishing composition is improved to a level particularly suitable for practical use.

The content of the abrasive grains in the polishing composition is preferably 1% by mass or more, more preferably 3% by mass or more. The more the content of the abrasive grains, the more improved the removal rate of polishing silicon material using the polishing composition becomes. In this respect, if the content of the abrasive grains in the polishing composition is 1% by mass or more, more specifically 3% by mass or more, the removal rate of polishing silicon material using the polishing composition is improved to a level particularly suitable for practical use.

The content of the abrasive grains in the polishing composition is preferably 25% by mass or less, more preferably 20% by mass or less. The lower the content of the abrasive grains, the more improved the dispersibility of the abrasive grains in the polishing composition becomes. In this respect, if the content of the abrasive grains in the polishing composition is 25% by mass or less, more specifically 20% by mass or less, the dispersibility of the abrasive grains in the polishing composition is improved to a level particularly suitable for practical use.

The type of the pH adjuster, which is added to the polishing composition as needed, is not specifically restricted, and an appropriate amount of any acid or alkali may be used to adjust the pH of the polishing composition to a desired value in the pH range of 1 to 7. Similarly, the type of the pH buffer, which is added to the polishing composition as needed, is not specifically restricted, and an appropriate amount of any salt may be used to obtain a desired buffering effect. However, it is desirable to avoid using, as pH adjuster or pH buffer, a substance that has oxidation action such as nitric acid and nitrate salt, in other words, oxidizing agents. Not only nitric acid and nitrate salt, but also another oxidizing agent such as peroxide, which includes hydrogen peroxide, iodate, periodate, hypochlorite, chlorite, chlorate, perchlorate, persulfate, bichromate, permanganate, ozone water, divalent silver salt, trivalent iron salt may form an oxide film on the surface of silicon material being polished when added to the polishing composition. This can reduce the removal rate of polishing the silicon material using the polishing composition. Examples of acids that can be suitably used as the pH adjuster include inorganic acid such as sulfuric acid, hydrochloric acid, and phosphoric acid and organic acid such as acetic acid, glycolic acid, malic acid, tartaric acid, citric acid, lactic acid, α-alanine, and glycine. Alkaline agents that can be suitably used as the pH adjuster include ammonium hydroxide, tetramethylammonium hydroxide, sodium hydroxide, and potassium hydroxide.

The present embodiment provides the following advantages.

The use of the polishing composition according to the present embodiment allows silicon material such as a simple substance of silicon and a silicon compound to be polished at a high removal rate. Therefore, the polishing composition of the present embodiment is suitably used not only for polishing silicon material, specifically, polishing a simple substance of silicon or a silicon compound separately, but also for polishing a simple substance of silicon and a silicon compound simultaneously. The reason why the advantages mentioned above are obtained by using the polishing composition of the present embodiment is not understood in detail, but it is inferred that the advantages are brought about by the fact that, since an unshared electron pair existing in a nitrogen atom of the nitrogen-containing compound in the polishing composition have a high electron-donating ability, the polishing composition exerts high reactivity with silicon material even in a region from neutral to acidic pH. The electron-donating ability of the unshared electron pair is particularly increased when the nitrogen-containing compound has a structure expressed by the above formula (1).

Second Embodiment

A second embodiment of the present invention will now be described.

A polishing composition of the second embodiment is manufactured by mixing a water-soluble polymer and abrasive grains in water, together with a pH adjuster and a pH buffer if necessary, such that the pH falls within the range of 1 to 8. Therefore, the polishing composition contains a water-soluble polymer, abrasive grains, and water, and if necessary, a pH adjuster and a pH buffer. That is, the polishing composition of the second embodiment is different from the polishing composition of the first embodiment in that a water-soluble polymer is added instead of the nitrogen-containing compound, and that the pH is within the range of 1 to 8, but not in the range of 1 to 7.

Examples of the water-soluble polymer include: a polysaccharide such as alginic acid, pectic acid, carboxymethyl cellulose, starch, agar, curdlan, and pullulan; a polycarboxylic acid, polycarboxylic amide, polycarboxylic ester, and polycarboxylate, which include poly(aspartic acid), poly(glutamic acid), polylysine, poly(malic acid), poly(methacrylic acid), ammonium polymethacrylate, sodium polymethacrylate, poly(maleic acid), poly(itaconic acid), poly(fumaric acid), poly(p-styrenecarboxylic acid), poly(acrylic acid), polyacrylamide, aminopolyacrylamide, poly(methyl acrylate), poly(ethyl acrylate), ammonium polyacrylate, sodium polyacrylate, poly(amide acid), ammonium polyamidate, sodium polyamidate, and poly(glyoxylic acid); a polysulfonic acid such as polystyrene sulfonic acid; and a vinyl polymer such as polyvinyl alcohol, polyvinylpyridine, polyvinylpyrrolidone, and polyacrolein. However, in order to prevent silicon material to be polished from being contaminated by alkali metal, alkaline earth metal, or halide, it is preferable to use a water-soluble polymer having no alkali metal, alkaline earth metal, and halide in the molecule. The content of the water-soluble polymer in the polishing composition is preferably in the range of 0.1 to 5.0 g/L.

The second embodiment has the following advantages.

The use of the polishing composition according to the second embodiment allows a simple substance of silicon to be polished at a high removal rate. Therefore, the polishing composition of the second embodiment is suitably used for polishing a simple substance of silicon. The reason why the polishing composition of the second embodiment allows a simple substance of silicon to be polished at a high removal rate is not understood in detail, but it is inferred that the advantage is brought about by the fact that the water-soluble polymer in the polishing composition modifies the surface of the simple substance of silicon.

As in the case of the polishing composition of the first embodiment, the removal rate of polishing a simple substance of silicon using the polishing composition of the second embodiment can be lowered by the existence of an oxidizing agent. In this respect, since the polishing composition of the second embodiment contains no oxidizing agent, the removal rate of polishing silicon material is not reduced by an oxidizing agent.

The first and second embodiments may be modified as follows.

The polishing composition of the first embodiment may contain two or more types of nitrogen-containing compounds.

The polishing composition of the second embodiment may contain two or more types of water-soluble polymers.

The polishing compositions of the first and second embodiments may contain two or more types of abrasive grains.

The polishing composition of the first embodiment may contain any component other than the nitrogen-containing compound, abrasive grains, and water. For example, additives such as a chelating agent, a water-soluble polymer, surfactant, antiseptic, fungicide, and rust preventive may be added as needed.

The polishing composition of the second embodiment may contain any component other than the water-soluble polymer, abrasive grains, and water. For example, additives such as a chelating agent, surfactant, antiseptic, fungicide, and rust preventive may be added as needed.

The polishing compositions of the first and second embodiments may be prepared by diluting liquid concentrate of the polishing composition with water.

Next, the present invention will be further specifically described by examples.

In Examples 1 to 21 and Reference Examples 1 to 5, polishing compositions were each prepared by mixing a nitrogen-containing compound and abrasive grains, together with a pH adjuster as needed, with water. In Comparative Example 1 to 5, polishing compositions were each prepared by mixing abrasive grains, together with a pH adjuster as needed, with water. Table 1 shows the specifics of the nitrogen-containing compound in each polishing composition, and the results of measurement of the pH of each polishing composition. The abrasive grains used in all the examples were colloidal silica having an average secondary particle size of 30 nm, and the content of the colloidal silica in each polishing composition was 5% by mass. The pH adjuster used in some of the examples was acetic acid or potassium hydroxide.

Using each polishing composition, the surface of a substrate that had a diameter of 200 mm and a polysilicon film was polished under the conditions shown in Table 2. The thickness of each substrate before polishing and that after polishing were measured by using LAMBDA ACE VM-2030, an optical interferometric film thickness measurement system manufactured by Dainippon Screen MFG. Co., Ltd. The polysilicon removal rate was determined by dividing the difference between the thickness of each substrate before polishing and that after polishing by polishing time. If the polysilicon removal rate using the polishing composition of Example 4 is defined as 100, the polysilicon removal rates of the polishing compositions of the other examples are as shown in the column "polysilicon removal rate" as relative values.

Using each of the polishing compositions of some of the examples, the surface of a substrate that had a diameter of 200 mm and a silicon nitride film was polished under the conditions shown in Table 2. The thickness of each substrate before polishing and that after polishing were measured by using LAMBDA ACE VM-2030, an optical interferometric film thickness measurement system. The silicon nitride removal rate was determined by dividing the difference between the thickness of each substrate before polishing and that after polishing by polishing time. If the silicon nitride removal rate using the polishing composition of Example 4 is defined as 100, the silicon nitride removal rates of the polishing compositions of the other examples are as shown in the column "silicon nitride removal rate" as relative values.

TABLE 1

| | Nitrogen-Containing Compound | | | Polysilicon | Silicon Nitride |
| | Type | Concentration (mol/L) | pH | Removal Rate (relative value) | Removal Rate (relative value) |
|---|---|---|---|---|---|
| Example 1 | piperazine | 0.05 | 5.0 | 15 | 105 |
| Reference Example 1 | piperazine | 0.05 | 11.0 | 250 | 18 |
| Example 2 | 1-methyl-2-pyrrolidone | 0.05 | 3.0 | 80 | 24 |
| Example 3 | 1-methyl-2-pyrrolidone | 0.05 | 4.0 | 113 | 74 |
| Example 4 | 1-methyl-2-pyrrolidone | 0.05 | 5.0 | 100 | 100 |
| Example 5 | 1-methyl-2-pyrrolidone | 0.05 | 6.0 | 78 | 93 |
| Example 6 | 1-methyl-2-pyrrolidone | 0.05 | 7.0 | 53 | 88 |
| Reference Example 2 | 1-methyl-2-pyrrolidone | 0.05 | 8.0 | 107 | 44 |
| Reference Example 3 | 1-methyl-2-pyrrolidone | 0.05 | 9.0 | 124 | 17 |
| Reference Example 4 | 1-methyl-2-pyrrolidone | 0.05 | 10.0 | 135 | 16 |
| Reference Example 5 | 1-methyl-2-pyrrolidone | 0.05 | 11.0 | 100 | 16 |
| Comparative Example 1 | none | 0 | 3.0 | 1 | 20 |
| Comparative Example 2 | none | 0 | 4.0 | 2 | 71 |
| Comparative Example 3 | none | 0 | 5.0 | 4 | 95 |
| Comparative Example 4 | none | 0 | 8.0 | 4 | 39 |
| Comparative Example 5 | none | 0 | 11.0 | 4 | 10 |
| Example 7 | 1-ethyl-2-pyrrolidone | 0.05 | 5.0 | 100 | not measured |
| Example 8 | N,N-dimethylacetamide | 0.05 | 5.0 | 90 | not measured |
| Example 9 | N,N-diethylacetamide | 0.05 | 5.0 | 99 | not measured |
| Example 10 | methylpiperidine | 0.05 | 5.0 | 92 | not measured |
| Example 11 | pyridine | 0.05 | 5.0 | 99 | not measured |
| Example 12 | iminodiacetic acid | 0.05 | 5.0 | 38 | not measured |
| Example 13 | hydantoin | 0.05 | 5.0 | 11 | not measured |
| Example 14 | succinimide | 0.05 | 5.0 | 17 | not measured |
| Example 15 | N-hydroxy succinimide | 0.05 | 5.0 | 11 | not measured |
| Example 16 | piperidine | 0.05 | 5.0 | 64 | not measured |
| Example 17 | pyrrolidine | 0.05 | 5.0 | 54 | not measured |
| Example 18 | glycine | 0.05 | 5.0 | 17 | not measured |
| Example 19 | alanine | 0.05 | 5.0 | 11 | not measured |
| Example 20 | valine | 0.05 | 5.0 | 15 | not measured |
| Example 21 | N-methylglycine | 0.05 | 5.0 | 15 | not measured |

TABLE 2

Polisher: "Mirra" manufactured by Applied Materials, Inc.
Platen diameter: 380 nm
Polishing pad: "IC-1010 M-Groove" manufactured by Rohm and Haas Company
Polishing pressure: approximately 14 kPa (=2.0 psi)
Rotation speed of machine platen: 63 rpm
Rotation speed of head: 57 rpm
Feeding rate of polishing composition: 200 mL/min.
Dressing: In-situ (#100 diamond dresser used)
Polishing time: 60 seconds As clearly shown in Table 1, it was observed that the polysilicon removal rate in neutral to acidic regions was increased by adding a nitrogen-containing compound to the polishing composition. Such increase in the polysilicon removal rate in the neutral to acidic regions was particularly pronounced when a compound having a structure expressed by the above formula (1) was used as the nitrogen-containing compound (refer to Examples 2 to 11). This tendency of increase in removal rate by addition of a nitrogen-containing compound was observed not only during the polishing of polysilicon, but also during the polishing of silicon single crystal and amorphous silicon. Also, as clearly shown in Table 1, the silicon nitride removal rate was high in the neutral to acidic regions and had a peak approximately at pH 5. It was also observed that the silicon nitride removal rate was increased by addition of a nitrogen-containing compound. These findings indicate that the polishing composition of the present invention is suitably used not only for polishing a simple substance of silicon such as polysilicon, but also for polishing a simple substance of silicon and a silicon compound such as silicon nitride simultaneously.

In Examples 101 to 123, a pH adjuster and water, and further an ampholytic surfactant, were added to abrasive grains to prepare polishing compositions. In Examples 201 to 205, a pH adjuster and water, and further a nitrogen-containing surfactant, were added to abrasive grains to prepare polishing compositions. In Examples 301 to 337, a pH adjuster and water, and further a water-soluble polymer, were added to abrasive grains to prepare polishing compositions. In Comparative Examples 101 to 109, a pH adjuster and water were added to abrasive grains to prepare polishing compositions. Tables 3 to 6 show the specifics of the ampholytic surfactant, the nitrogen-containing surfactant, and the water soluble polymer in each polishing composition, and the results of measurement of the pH of each polishing composition. The pH adjuster used in all the examples was acetic acid.

In Tables 3 to 6,

A1a represents colloidal silica having an average secondary particle size of 70 nm;

A1b represents colloidal silica having an average secondary particle size of 30 nm;

A2 represents fumed silica having an average secondary particle size of 150 nm;

B1 represents 2-oleyl-N-carboxymethyl-N-hydroxyethyl imidazolium betaine;

B2 represents alkyl($C_{12}$ to $C_{14}$)dimethylamino betaine acetate;

B3 represents alkyl($C_{12}$ to $C_{14}$)amidopropyl dimethylamino betaine acetate;

B4 represents alkyl($C_{12}$ to $C_{14}$)dimethylamine oxide;

B5 represents laurylhydroxysulfobetaine;

B6 represents alkyl($C_{12}$ to $C_{14}$)amidosarcosine;

B7 represents laurylaminopropionic acid;

C1 represents POE(2)laurylamino ether;

C2 represents POE(10)laurylamino ether;

C3 represents POE(5)oleylamino ether;

D1a represents poly(acrylic acid) having a mean molecular weight of 3,000;

D1b represents poly(acrylic acid) having a mean molecular weight of 5,500;

D2 represents polyacrylic amide having a mean molecular weight of 200,000;

D3 represents carboxymethyl cellulose having a mean molecular weight of 80,000;

D4 represents starch (biochemical agent) manufactured by Wako Pure Chemical Industries, Ltd.;

D5 represents pullulan (reagent) manufactured by Hayashibara Biochemical Laboratories, Inc.;

D6a represents polyvinyl alcohol having a mean molecular weight of 8,800;

D6b represents polyvinyl alcohol having a mean molecular weight of 22,026;

D6c represents polyvinyl alcohol having a mean molecular weight of 66,078;

D6d represents polyvinyl alcohol having a mean molecular weight of 1057,25;

D6e represents polyvinyl alcohol having a mean molecular weight of 146,000;

D7a represents polyvinylpyrrolidone having a mean molecular weight of 15,000;

D7b represents polyvinylpyrrolidone having a mean molecular weight of 29,000;

D7c represents polyvinylpyrrolidone having a mean molecular weight of 30,000;

D7d represents polyvinylpyrrolidone having a mean molecular weight of 40,000;

D7e represents polyvinylpyrrolidone having a mean molecular weight of 360,000;

D8 represents polyvinylpyridine having a mean molecular weight of 60,000; and

D9 represents polystyrene sulfonic acid having a mean molecular weight of 18,320.

The column titled "polysilicon removal rate" of Tables 3 to 6 shows removal rate when, using the polishing composition of each example, the surface of a substrate that had a diameter of 200 mm and a polysilicon film was polished under the conditions shown in Table 7. The thickness of each substrate before polishing and that after polishing were measured by using LAMBDA ACE VM-2030, an optical interferometric film thickness measurement system manufactured by Dainippon Screen MFG. Co., Ltd. The removal rate was determined by dividing the difference between the thickness of each substrate before polishing and that after polishing by polishing time.

TABLE 3

| | Abrasive Grains | | Ampholytic Surfactant | | | Polysilicon |
|---|---|---|---|---|---|---|
| | Type | Content (mass %) | Type | Content (g/L) | pH | Removal Rate (nm/min) |
| Example 101 | A1a | 5 | B1 | 0.02 | 2.0 | 162 |
| Example 102 | A1a | 5 | B1 | 0.02 | 2.5 | 142 |
| Example 103 | A1a | 5 | B1 | 0.02 | 3.5 | 581 |
| Example 104 | A1a | 5 | B1 | 0.02 | 4.0 | 679 |
| Example 105 | A1a | 5 | B1 | 0.02 | 5.0 | 970 |
| Example 106 | A1a | 5 | B1 | 0.02 | 8.0 | 1300 |
| Example 107 | A1a | 5 | B2 | 0.02 | 2.0 | 232 |
| Example 108 | A1a | 5 | B2 | 0.02 | 3.0 | 247 |
| Example 109 | A1a | 5 | B2 | 0.02 | 3.5 | 438 |
| Example 110 | A1a | 5 | B2 | 0.02 | 4.0 | 699 |
| Example 111 | A1a | 5 | B2 | 0.02 | 5.0 | 756 |
| Example 112 | A1a | 5 | B2 | 0.02 | 6.5 | 1100 |
| Example 113 | A1a | 5 | B2 | 0.02 | 8.0 | 756 |
| Example 114 | A1a | 5 | B3 | 0.002 | 5.0 | 702 |
| Example 115 | A1a | 5 | B3 | 0.02 | 5.0 | 970 |
| Example 116 | A1a | 5 | B3 | 0.20 | 5.0 | 849 |
| Example 117 | A1a | 5 | B2 | 0.02 | 5.0 | 800 |
| Example 118 | A1b | 5 | B3 | 0.02 | 5.0 | 756 |
| Example 119 | A1a | 5 | B4 | 0.02 | 5.0 | 1141 |
| Example 120 | A1b | 5 | B5 | 0.02 | 5.0 | 496 |
| Example 121 | A1b | 5 | B6 | 0.02 | 5.0 | 754 |
| Example 122 | A1b | 5 | B7 | 0.02 | 5.0 | 701 |
| Example 123 | A2 | 10 | B1 | 0.02 | 5.0 | 589 |

TABLE 4

| | Abrasive Grains | | Nitrogen-Containing Surfactant | | | Polysilicon |
|---|---|---|---|---|---|---|
| | Type | Content (mass %) | Type | Content (g/L) | pH | Removal Rate (nm/min) |
| Example 201 | A1b | 5 | C1 | 0.10 | 5.0 | 1253 |
| Example 202 | A1b | 5 | C2 | 0.10 | 5.0 | 755 |
| Example 203 | A1b | 5 | C3 | 0.002 | 5.0 | 541 |
| Example 204 | A1b | 5 | C3 | 0.10 | 5.0 | 834 |
| Example 205 | A1b | 5 | C3 | 1.0 | 5.0 | 242 |

TABLE 5

| | Abrasive Grains | | Water-Soluble Polymer | | | Polysilicon |
|---|---|---|---|---|---|---|
| | Type | Content (mass %) | Type | Content (g/L) | pH | Removal Rate (nm/min) |
| Example 301 | A1a | 10 | D1a | 1.0 | 2.0 | 548 |
| Example 302 | A1a | 10 | D1b | 1.0 | 2.0 | 120 |
| Example 303 | A1a | 10 | D2 | 1.0 | 2.0 | 248 |
| Example 304 | A1a | 10 | D3 | 2.0 | 4.5 | 817 |
| Example 305 | A1a | 10 | D3 | 2.5 | 4.5 | 492 |
| Example 306 | A1a | 10 | D3 | 5.0 | 4.5 | 648 |
| Example 307 | A1b | 5 | D3 | 0.5 | 2.0 | 330 |
| Example 308 | A1b | 5 | D3 | 0.5 | 3.0 | 337 |
| Example 309 | A1b | 5 | D3 | 0.5 | 4.5 | 303 |
| Example 310 | A1b | 5 | D3 | 0.5 | 8.0 | 160 |
| Example 311 | A1b | 5 | D4 | 0.5 | 4.5 | 434 |
| Example 312 | A1a | 10 | D5 | 1.0 | 2.0 | 1007 |
| Example 313 | A1a | 5 | D6a | 0.5 | 2.0 | 798 |
| Example 314 | A1a | 5 | D6a | 0.5 | 3.0 | 760 |
| Example 315 | A1a | 5 | D6a | 0.5 | 4.0 | 401 |
| Example 316 | A1a | 5 | D6a | 0.5 | 5.0 | 344 |
| Example 317 | A1a | 5 | D6a | 0.5 | 6.0 | 304 |

TABLE 5-continued

|  | Abrasive Grains | | Water-Soluble Polymer | | | Polysilicon |
| --- | --- | --- | --- | --- | --- | --- |
|  | Type | Content (mass %) | Type | Content (g/L) | pH | Removal Rate (nm/min) |
| Example 318 | A1b | 5 | D6b | 0.1 | 5.0 | 1334 |
| Example 319 | A1b | 5 | D6c | 0.1 | 5.0 | 1200 |
| Example 320 | A1a | 10 | D6d | 2.0 | 2.0 | 812 |
| Example 321 | A1b | 5 | D6e | 0.1 | 5.0 | 147 |
| Example 322 | A1b | 5 | D7a | 1.0 | 5.0 | 349 |
| Example 323 | A1b | 5 | D7b | 1.0 | 5.0 | 821 |
| Example 324 | A1b | 5 | D7c | 1.0 | 5.0 | 888 |
| Example 325 | A1a | 5 | D7d | 0.1 | 2.0 | 202 |
| Example 326 | A1a | 5 | D7d | 0.1 | 2.5 | 235 |
| Example 327 | A1a | 5 | D7d | 0.1 | 3.5 | 516 |
| Example 328 | A1a | 5 | D7d | 0.1 | 4.0 | 470 |
| Example 329 | A1a | 5 | D7d | 0.1 | 4.5 | 493 |
| Example 330 | A1a | 5 | D7d | 0.1 | 5.0 | 440 |
| Example 331 | A1a | 5 | D7d | 0.1 | 6.0 | 475 |
| Example 332 | A1a | 5 | D7d | 0.1 | 8.0 | 423 |
| Example 333 | A1b | 5 | D7e | 0.5 | 4.5 | 429 |
| Example 334 | A1b | 5 | D8 | 0.1 | 5.0 | 892 |
| Example 335 | A1a | 10 | D9 | 1.0 | 2.0 | 98 |
| Example 336 | A2 | 10 | D6a | 0.5 | 5.0 | 284 |
| Example 337 | A2 | 10 | D7d | 0.1 | 5.0 | 392 |

TABLE 6

|  | Abrasive Grains | | | Polysilicon |
| --- | --- | --- | --- | --- |
|  | Type | Content (mass %) | pH | Removal Rate (nm/min) |
| Comparative Example 101 | A1a | 10 | 1.5 | 46 |
| Comparative Example 102 | A1a | 10 | 2.0 | 37 |
| Comparative Example 103 | A1a | 10 | 2.5 | 41 |
| Comparative Example 104 | A1a | 10 | 3.0 | 27 |
| Comparative Example 105 | A1a | 10 | 4.0 | 41 |
| Comparative Example 106 | A1a | 10 | 4.5 | 54 |
| Comparative Example 107 | A1a | 10 | 5.0 | 79 |
| Comparative Example 108 | A1a | 10 | 5.5 | 143 |
| Comparative Example 109 | A1a | 10 | 8.0 | 85 |

TABLE 7

Polisher: "Mirra" manufactured by Applied Materials, Inc.
Platen diameter: 380 nm
Polishing pad: "IC-1010 M-Groove" manufactured by Rohm and Haas Company
Polishing pressure: approximately 14 kPa (=2.0 psi)
Rotation speed of machine platen: 63 rpm
Rotation speed of head: 57 rpm
Feeding rate of polishing composition: 200 mL/min.
Dressing: In-situ (#100 diamond dresser used)
Polishing time: 60 seconds As clearly shown in Tables 3 to 6, the polysilicon removal rate using a polishing composition tended to increase when an ampholytic surfactant, a nitrogen-containing surfactant, or water-soluble polymer was added. This tendency was observed not only during the polishing of polysilicon, but also during the polishing of a silicon single crystal and amorphous silicon.

This completes the description of the preferred and alternate embodiments of the invention. Those skilled in the art may recognize other equivalents to the specific embodiment described herein which equivalents are intended to be encompassed by the claims attached hereto.

The invention claimed is:

1. A polishing composition comprising a nitrogen-containing compound and colloidal silica abrasive grains, the pH of the composition being in the range of 1 to 5, wherein the nitrogen-containing compound is selected from the group consisting of N,N-diethylacetamide, alkyl diethanolamine, alkylamine to which polyoxypropylene and polyoxyethylene are added in blocks, N,N',N'-tris(2-hydroxyethyl)-N-alkyl-1,3-diaminopropane, alkylhydroxysulfobetaine, piperazine, methylpiperidine, pyridine, succinimide, N-hydroxy succinimide, piperidine, and pyrrolidine, the colloidal silica abrasive grains are contained in the polishing composition in an amount of 3% by mass or more and 25% by mass or less, the colloidal silica abrasive grains have an average secondary particle size of 5 nm to 250 nm, and the polishing composition does not contain any oxidizing agent selected from the group consisting of nitric acid, nitrate, peroxide, iodate, periodate, hypochlorite, chlorite, chlorate, perchlorate, persulfate, bichromate, permanganate, ozone water, divalent silver salt, and trivalent iron salt.

2. The polishing composition according to claim 1, wherein the nitrogen-containing compound is N,N-diethylacetamide.

3. The polishing composition according to claim 1, wherein the nitrogen-containing compound is piperazine.

4. The polishing composition according to claim 1, wherein the nitrogen-containing compound is methylpiperidine or piperidine.

5. The polishing composition according to claim 1, wherein the nitrogen-containing compound is pyridine.

6. The polishing composition according to claim 1, wherein the nitrogen-containing compound is succinimide or N-hydroxy succinimide.

7. The polishing composition according to claim 1, wherein the nitrogen-containing compound is pyrrolidine.

8. The polishing composition according to claim 1, wherein the content of the colloidal silica abrasive grains in the polishing composition is 5% by mass or more and 25% by mass or less.

9. A polishing method comprising:
preparing the polishing composition according to claim 1; and
polishing a silicon material using the polishing composition.

10. A polishing composition comprising:
a water-soluble polymer selected from the group consisting of starch, polystyrene sulfonic acid, and polyvinylpyridine; and
colloidal silica abrasive grains having an average secondary particle size of 5 nm to 250 nm,
the pH of the composition being in the range of 1 to 8, wherein
the polishing composition does not contain any oxidizing agent selected from the group consisting of nitric acid, nitrate, peroxide, iodate, periodate, hypochlorite, chlorite, chlorate, perchlorate, persulfate, bichromate, permanganate, ozone water, divalent silver salt, and trivalent iron salt.

11. A polishing method comprising:
preparing the polishing composition according to claim 10; and
polishing a silicon material using the polishing composition.

12. A polishing composition comprising a nitrogen-containing compound and colloidal silica abrasive grains, the pH of the composition being in the range of 1 to 7, wherein the nitrogen-containing compound is alkyl diethanolamine, alkylamine to which polyoxypropylene and polyoxyethylene are added in blocks, or N,N',N'-tris(2-hydroxyethyl)-N-alkyl-1,3-diaminopropane, the colloidal silica abrasive grains have an average secondary particle size of 5 nm to 250 nm, and the polishing composition does not contain any oxidizing agent selected from the group consisting of nitric acid, nitrate, peroxide, iodate, periodate, hypochlorite, chlorite, chlorate, perchlorate, persulfate, bichromate, permanganate, ozone water, divalent silver salt, and trivalent iron salt.

13. A polishing composition comprising a nitrogen-containing compound and colloidal silica abrasive grains, the pH of the composition being in the range of 1 to 7, wherein the nitrogen-containing compound is alkylhydroxysulfobetaine, the colloidal silica abrasive grains have an average secondary particle size of 5 nm to 250 nm, and the colloidal silica abrasive grains are contained in the polishing composition in an amount of 1% by mass or more and 25% by mass or less.

14. A polishing composition comprising a nitrogen-containing compound and colloidal silica abrasive grains, wherein the pH of the polishing composition is in the range of 1 to 7, the nitrogen-containing compound is selected from the group consisting of, N,N-diethylacetamide, alkyl diethanolamine, alkylamine to which polyoxypropylene and polyoxyethylene are added in blocks, N,N',N'-tris(2-hydroxyethyl)-N-alkyl-1,3-diaminopropane, alkyldimethylamine oxide, piperazine, methylpiperidine, pyridine, hydantoin, succinimide, N-hydroxy succinimide, piperidine, and pyrrolidine, the colloidal silica abrasive grains have an average secondary particle size of 5 nm to 250 nm, and the polishing composition does not contain any oxidizing agent selected from the group consisting of nitric acid, nitrate, peroxide, iodate, periodate, hypochlorite, chlorite, chlorate, perchlorate, persulfate, bichromate, permanganate, ozone water, divalent silver salt, and trivalent iron salt.

* * * * *